United States Patent [19]
Patrin et al.

[11] Patent Number: 5,961,732
[45] Date of Patent: Oct. 5, 1999

[54] TREATING SUBSTRATES BY PRODUCING AND CONTROLLING A CRYOGENIC AEROSOL

[75] Inventors: John C. Patrin, Chanhassen; John M. Heitzinger, St. Louis Park, both of Minn.

[73] Assignee: FSI International, Inc, Chaska, Minn.

[21] Appl. No.: 08/872,958

[22] Filed: Jun. 11, 1997

[51] Int. Cl.[6] ........................................... B08B 3/02
[52] U.S. Cl. .................. 134/7; 134/2; 134/6; 134/21; 134/36; 134/902; 451/38; 451/39; 451/75; 451/102
[58] Field of Search ............................... 134/2, 6, 7, 21, 134/36, 902; 451/38, 39, 75, 102

[56] References Cited

U.S. PATENT DOCUMENTS

| 2,699,403 | 1/1955 | Courts | 117/47 |
| 3,676,963 | 7/1972 | Rice et al. | 51/320 |
| 3,703,519 | 11/1972 | Rice et al. | 51/310 |
| 4,027,686 | 6/1977 | Shortes et al. | 134/33 |
| 4,038,786 | 8/1977 | Fong | 51/320 |

(List continued on next page.)

FOREIGN PATENT DOCUMENTS

| 0 633 443 A1 | 1/1995 | European Pat. Off. . |
| 55-106538 | 8/1980 | Japan . |
| 61-223311 | 10/1986 | Japan . |
| 1-92071 | 4/1989 | Japan . |
| 2-43730 | 2/1990 | Japan . |

OTHER PUBLICATIONS

JP Abstract of JP 55–106538; vol. 4, No. 166 (c–031), Nov. 18, 1980.
JP Abstract of JP 2–43730, vol. 14, No. 200 (E–920), Apr. 24, 1990.
JP Abstract of JP 1–92071, vol. 13, No. 300 (M–848), Jul. 11, 1989.
JP Abstract of JP 61–223311, vol. 11, No. 67 (M–566), Feb. 28, 1987.
PCT search report for PCT/US98/12256.
Robert Sherman et al, "$CO_2$ Process Parameters and Automation Potentials", pp. 22–27, Jun. 1998.
John F. Williford, "The Advantages, Disadvantages, and History of $CO_2$ Snow Cleaning", pp. 12–17, Jun. 1998.
L. Layden et al, "High velocity carbon dioxide snow for cleaning vacuum system surfaces", *J. Vac. Sci. Tehcnol.*, pp. 38813883, Sep./Oct. 1990.
Ronald V. Peterson et al, "Contamination Removal by $CO_2$ Jet Spray", *Optical System Contamination:Effects, Measurement, Control II*, pp. 72–85, 1990.
Richard R. Zito et al, "Cleaning large optics with $CO_2$ snow", *Advanced Technology Optical Telescopes IV*, pp. 952–971, (1990).
Cryogenic Wafer Cleaning, *Micro Contamination Identification, Analysis and Control*, vol. 14(10), Nov./Dec. 1996 pp. 50, 52.
FSI Aries™ Cryokinetic Cleaning Systems Brochure (Sep. 1996).
R. D. Reitz, "Photographic Study of Flash Boiling Atomization", *Aerosol. Sci. Technol.*, vol. 12 pp. 561–569 (1990).
Rader et al, "Optical Direct–Reading Techniques: In Situ Sensing", *Aerosol Measurement: Principles, Techniques and Applications*, 1993, pp. 345–380.

*Primary Examiner*—Jill Warden
*Assistant Examiner*—S. Carrillo
*Attorney, Agent, or Firm*—Vidas, Arrett & Steinkraus, P.A.

[57] ABSTRACT

A substrate may be treated by impinging the substrate with a cryogenic aerosol spray wherein the cryogenic aerosol spray is formed by expanding a pressurized liquid or liquid/gaseous stream of one or more cryogens through a nozzle at a given distance from the substrate into a process chamber with a pressure of about $1.6 \times 10^4$ Pascal or less so as to form at least substantially solid aerosol particles of said one or more cryogens downstream from the nozzle by the cooling resulting from the expansion and/or evaporation to form an at least substantially solid particle containing aerosol.

11 Claims, 5 Drawing Sheets

U.S. PATENT DOCUMENTS

| | | | |
|---|---|---|---|
| 4,356,084 | 10/1982 | Hatton et al. | 209/211 |
| 4,389,820 | 6/1983 | Fong et al. | 51/410 |
| 4,489,740 | 12/1984 | Rattan et al. | 134/140 |
| 4,631,250 | 12/1986 | Hayashi | 430/329 |
| 4,655,847 | 4/1987 | Ichinoseki et al. | 134/7 |
| 4,744,181 | 5/1988 | Moore et al. | 51/436 |
| 4,747,421 | 5/1988 | Hayashi | 134/201 |
| 4,768,534 | 9/1988 | Anderson | 134/175 |
| 4,806,171 | 2/1989 | Whitcock et al. | 134/7 |
| 4,817,652 | 4/1989 | Liu et al. | 134/102 |
| 4,857,113 | 8/1989 | Hodge | 134/32 |
| 4,936,922 | 6/1990 | Cherry | 134/22.18 |
| 4,962,891 | 10/1990 | Layden | 239/597 |
| 4,972,677 | 11/1990 | Moriya et al. | 62/50 |
| 4,973,379 | 11/1990 | Brock et al. | 156/640 |
| 4,974,375 | 12/1990 | Tada et al. | 51/413 |
| 4,977,910 | 12/1990 | Miyahara et al. | 134/7 |
| 5,001,084 | 3/1991 | Kawai et al. | 437/231 |
| 5,009,240 | 4/1991 | Levi | 134/7 |
| 5,025,597 | 6/1991 | Tada et al. | 51/410 |
| 5,035,750 | 7/1991 | Tada et al. | 314/7 |
| 5,062,898 | 11/1991 | McDermott et al. | 134/7 |
| 5,094,696 | 3/1992 | Orsen | 134/38 |
| 5,108,512 | 4/1992 | Goffnet et al. | 134/7 |
| 5,108,799 | 4/1992 | Hoy et al. | 427/422 |
| 5,125,979 | 6/1992 | Swain et al. | 134/7 |
| 5,129,956 | 7/1992 | Pickering et al. | 134/15 |
| 5,147,466 | 9/1992 | Ohmori et al. | 134/7 |
| 5,158,100 | 10/1992 | Tanaka et al. | 134/105 |
| 5,181,985 | 1/1993 | Lampert et al. | 156/635 |
| 5,195,548 | 3/1993 | Roger | 134/167 |
| 5,209,028 | 5/1993 | McDermott et al. | 51/426 |
| 5,217,925 | 6/1993 | Ogawa et al. | 437/225 |
| 5,258,097 | 11/1993 | Mastrangelo | 156/644 |
| 5,259,890 | 11/1993 | Goff | 134/32 |
| 5,288,333 | 2/1994 | Tanaka et al. | 134/31 |
| 5,294,261 | 3/1994 | McDermott et al. | 134/7 |
| 5,315,793 | 5/1994 | Peterson et al. | 51/415 |
| 5,354,384 | 10/1994 | Sneed et al. | 134/6 |
| 5,364,474 | 11/1994 | Williford, Jr. | 134/32 |
| 5,366,156 | 11/1994 | Bauer et al. | 239/135 |
| 5,372,652 | 12/1994 | Srikrishnan et al. | 134/7 |
| 5,377,911 | 1/1995 | Bauer et al. | 239/135 |
| 5,378,312 | 1/1995 | Gifford et al. | 156/643 |
| 5,456,758 | 10/1995 | Menon | 134/33 |
| 5,486,132 | 1/1996 | Cavaliere et al. | 451/75 |
| 5,512,106 | 4/1996 | Tamai et al. | 134/7 |
| 5,555,902 | 9/1996 | Menon | 134/199 |
| 5,679,062 | 10/1997 | Goenka | 451/175 |

HIGH CHAMBER PRESSURE

LIQUID BREAKUP FROM A HIGH VELOCITY GAS

LOW PRESSURE CHAMBER

"EFFERVESCENT FLASHING"

TREATING SUBSTRATES BY PRODUCING AND CONTROLLING A CRYOGENIC AEROSOL

BACKGROUND OF THE INVENTION

The present invention relates to a process for producing a cryogenic aerosol and controlling the physical properties of a cryogenic aerosol.

The present invention has been developed for its applicability to the semi-conductor and micro-electronics industries and in particular to the cleaning of contaminated substrates, including, for example, semiconductor wafers of silicon and of gallium arsenide, multiple chip carriers, flat panel displays, magnetic hard disks, MEMs (microelectromechanical systems) and other electronic devices. Many methods have been developed to clean such surfaces. Techniques include the use of solvents or chemical cleaning for removing contaminant films from surfaces, the use of high energy sonic waves, and combinations thereof. Solvents for chemicals may be applied as gas jets or liquid spray. Aerosol sprays using frozen water vapor have been disclosed by Tada et al. (U.S. Pat. No. 5,035,750, U.S. Pat. No. 5,025,597 and U.S. Pat. No. 4,974,375).

More recently, cryogenic aerosols have been developed for jet spraying against surfaces, particularly within the semi-conductor industry to facilitate particulate decontamination as described in McDermott et al. (U.S. Pat. No. 5,294,261) and Tamai et al. (U.S. Pat. No. 5,512,106), both of whose contents are incorporated herein by reference, and for the elimination of stiction as described in copending application assigned to the same assignee hereof filed concurrently herewith, entitled "Eliminating Stiction with the Use of Cryogenic Aerosol", application Ser. No. 08/823,270 incorporated herein by reference.

Cryogenic aerosols are formed by delivering a gaseous and/or liquid cryogen to a nozzle. Upon expelling the mixture from the nozzle, the cryogenic aerosol is formed as described in copending U.S. application Ser. No. 08/773,489, filed Dec. 23, 1996 and incorporated herein by reference. The cryogenic aerosol contains at least substantially solid aerosol particles of the cryogen. The term "aerosol particles" as used herein refers to droplets comprised of liquid and/or solid generally of about 0.01 to about 100 microns in diameter or larger. The aerosol particles may further be partially solid or partially liquid.

Typically, cryogenic aerosols are formed from chemicals such as argon, nitrogen, carbon dioxide and mixtures thereof. Argon and nitrogen, both of which are inert, are the preferred components of cryogenic aerosols. Other inert chemicals may be used as well.

Until now, cryogenic aerosols have been formed by expanding the gaseous and/or liquid cryogen into a process chamber at a pressure upwards of $2 \times 10^4$ Pascal. At such pressures, cryogenic aerosols are characterized by high mass and low velocity aerosol particles. Also, the aerosol density (number of aerosol particles per unit volume) is low. Treatment of surfaces with these high mass aerosol particles can result in insufficient cleaning, especially for contaminant particles five microns in diameter or smaller. As the semi-conductor industry moves to ever smaller geometries, the need for 'cleaner' substrates becomes more pronounced. While present standards allow for up to 1700 contaminant particles of size 0.12 microns and greater per square meter, it is projected that by 2010, industry standards will allow for no more than 150 contaminant particles of size 0.02 microns and greater per square meter. With these increasingly stringent industry demands, there is a need for more efficient treatment methods, in particular, treatment methods that are capable of successfully treating surfaces with small contaminant particles.

SUMMARY OF THE INVENTION

It is an object of the present invention to provide a method for treating substrates, the method characterized by an improved contaminant particle removal efficiency, the method being well suited for removing small contaminant particles.

The present invention provides a method for forming a cryogenic aerosol by expanding a pressurized liquid or liquid/gaseous stream of one or more cryogens through a nozzle into a process chamber with a pressure of about $1.6 \times 10^4$ Pascal or below. At least substantially solid aerosol particles of the one or more cryogens are formed by the cooling resulting from the expansion and/or evaporation thus resulting in an aerosol containing at least substantially solid aerosol particles.

In another aspect, the present invention provides a method for treating a substrate by impinging the substrate with a cryogenic aerosol spray formed as described above.

In another aspect, the invention provides a method for forming a cryogenic aerosol by expanding a pressurized liquid or liquid/gaseous stream of one or more cryogens through a nozzle into a process chamber of lower pressure such that the pressurized liquid or liquid/gaseous stream is subjected to effervescent flashing downstream of the nozzle thereby forming a cryogenic aerosol of at least substantially solid aerosol particles. The term 'effervescent flashing' as used herein shall refer to a mechanism for aerosol formation in which rapid bubble growth occurs and is responsible for the breakup of the cryogen stream. Said bubbles may exist in the cryogen stream prior to the expulsion of the cryogen from the nozzle and/or the bubbles may be nucleated following expulsion of the cryogen from the nozzle.

In another embodiment, the invention provides a cryogenic aerosol spray formed by effervescent flashing a liquid or liquid/gaseous stream as described above.

The present invention, in its various embodiments, marks a departure from the prior art in that the aerosol particles of the cryogenic aerosol are formed by expanding the liquid or liquid/gaseous stream in a low pressure regime where a new mechanism for aerosol particle formation is operative and predominates. The resulting cryogenic aerosols, formed downstream of the nozzle, are characterized by higher velocity and lower mass aerosol particles than cryogenic aerosols formed by other methods. Additionally, the aerosol density (number of particles per unit volume) is higher. The present invention results in greater contaminant removal efficiency in general, and in dramatic improvement in particle removal efficiency for contaminant particles smaller than about 0.3 micron.

DETAILED DESCRIPTION OF THE INVENTION

Cryogenic aerosol cleaning of substrates is carried out by impinging a stream of aerosol particles at a high velocity against a substrate to be cleaned. Without being bound by a particular theory, the impinging aerosol particles are believed to impart sufficient energy so as to dislodge contaminants from the surface of the substrate. The dislodged contaminants may then be carried away in a gas flow. In producing aerosol particles, care must be taken to avoid the production of aerosol particles that are massive and result in a low density aerosol (low number of particles per unit volume) and inefficient cleaning of the substrate. Decreasing the mass of the aerosol particles, however, results in a linear decrease in the energy of the aerosol particles. Since energy is related to the square of the velocity, this decrease in energy can be offset by increasing the velocity of the aerosol particle. Most desirable are aerosols with a high aerosol density (large number of aerosol particles per unit volume) comprising high velocity, low mass aerosol particles that are capable of efficiently cleaning a substrate and removing both large contaminant particles (24 about 0.3 micron) and small contaminant particles ($\leq$about 0.3 micron).

A method for forming a cryogenic aerosol has been discovered comprising high velocity, low mass aerosol particles. The cryogenic aerosol of the present invention is particularly useful in removing small contaminant particles from the surface of a substrate and fills a developing need in the semiconductor industry.

Cryogenic aerosols are formed by delivering a liquid or liquid/gaseous cryogen to a nozzle. Upon expelling the mixture from the nozzle, a cryogenic aerosol is formed. The so-formed cryogenic aerosol may contain substantially solid and/or liquid aerosol particles of the cryogen. The aerosol particles may further be partially solid or partially liquid.

Figure 1:
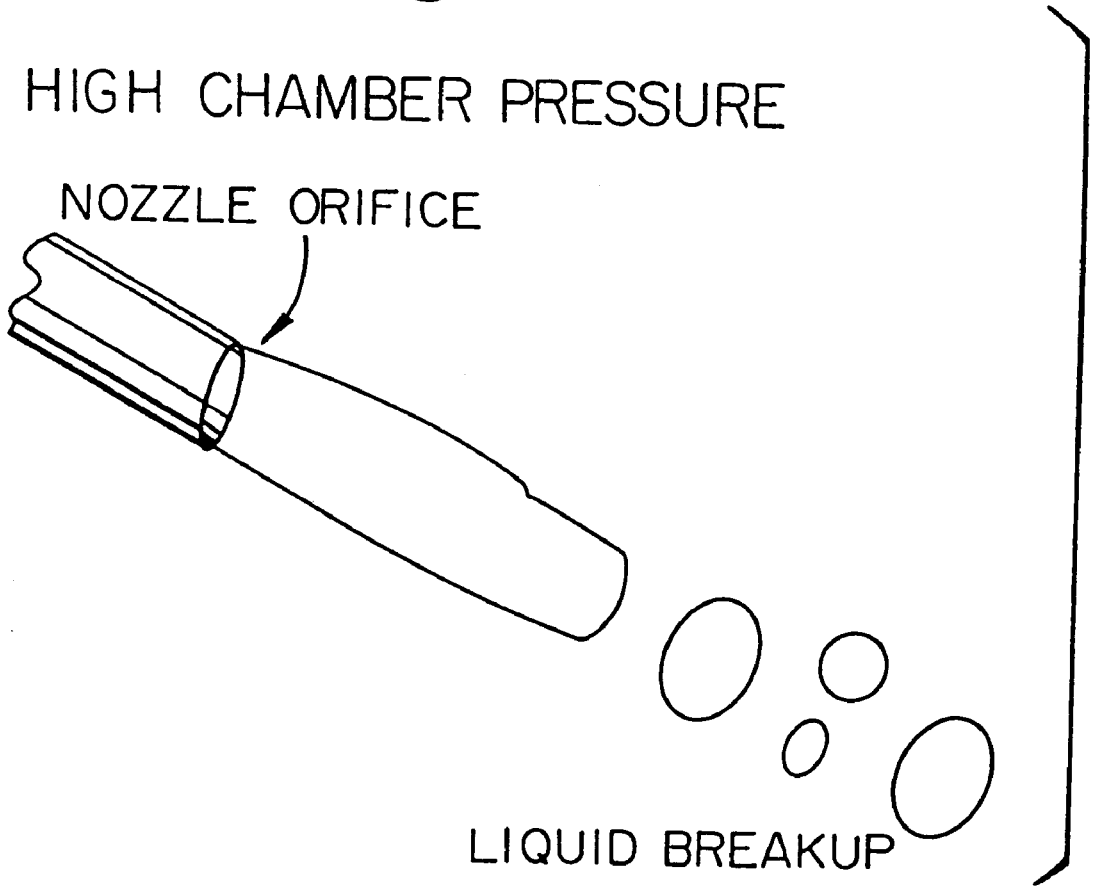
FIG. 1 depicts aerosol atomization occurring at high process chamber pressure as a result of breakup of a liquid cylindrical core by surface oscillations creating large drops.
Figure 2:
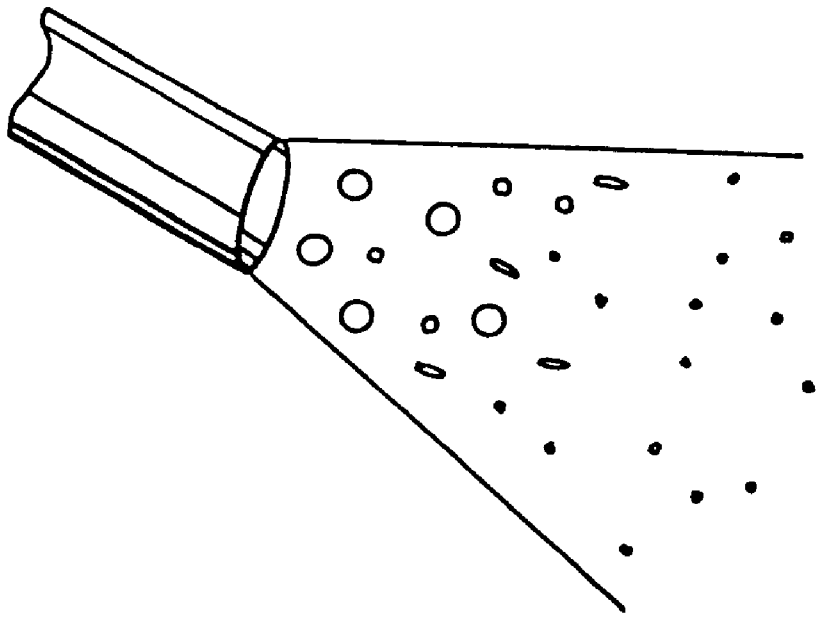
FIG. 2 depicts aerosol atomization occurring at high process chamber pressure by liquid breakup from a high velocity gas jet.

The distribution of aerosol particle sizes and energies in a cryogenic aerosol depends on the thermodynamic conditions including pressures and temperatures of the cryogen and process chamber, on the initial phase of the cryogen, on the flow rate of the cryogen and the technique that is used to form the cryogenic aerosol. In the present application, the pressure of the process chamber as well as the pressure of the cryogen prior to expansion is of interest. Using one of the standard techniques for formation of cryogenic aerosols, wherein a liquid and gaseous mixture is expanded from a higher pressure to a process chamber at a pressure of at least $2 \times 10^4$ Pascal, a disturbance of the liquid stream occurs by some method (non-symmetric flow, air flow etc.) leading to droplet formation. If the wavelength of the disturbance is less than some minimum wavelength, the disturbance is damped out by the surface forces of the liquid. If the wavelength of the disturbance is longer than this minimum wavelength, the liquid stream will breakup into droplets. One mechanism for disturbing the liquid stream is illustrated in FIG. 1 which depicts aerosol atomization by liquid breakup from surface oscillations. Another mechanism for disturbing the liquid stream is illustrated in FIG. 2 which depicts aerosol atomization by liquid breakup from a high velocity gas jet at high process chamber pressure.

Figure 3:
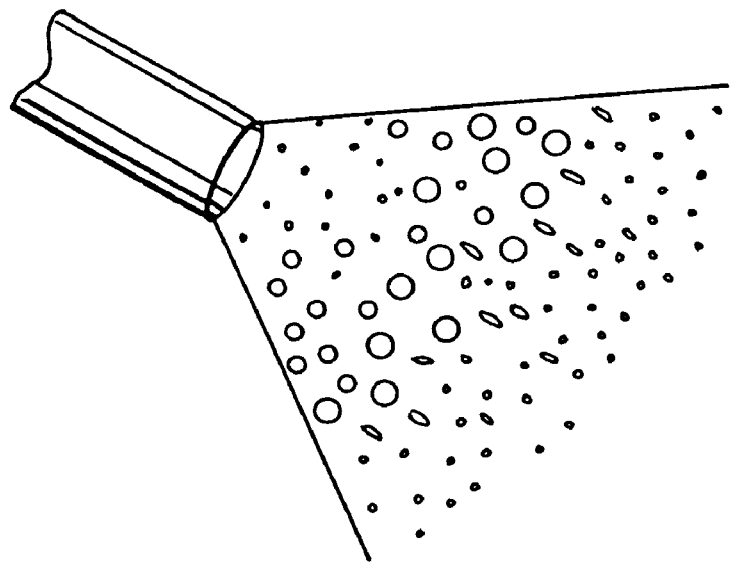
FIG. 3 depicts aerosol atomization occurring at low process chamber pressure by the rapid nucleation and growth of bubbles within a liquid cryogen.

It has been discovered, however, that when the same mixture is expanded into a process chamber with a pressure below $1.6 \times 10^4$ Pascal, a third mechanism for breaking up the liquid stream, described herein as effervescent flashing, becomes a major factor. At such low pressures, rapid bubble formation and/or growth occurs in the liquid stream. Without being bound by a particular theory, breakup of the liquid stream into droplets by this mechanism is thought to occur in the following way in the case of expansion into a low pressure chamber. Upon exiting the nozzle orifice, the liquid experiences a large pressure drop. Because the pressure in the process chamber is very low (e.g., about $1.6 \times 10^4$ Pascal or less) the liquid is well above its boiling temperature (superheated) at the process chamber pressure. Rapid growth of bubbles pre-existing in the cryogen stream and/or formation of bubbles followed by rapid growth ensues) leading to shattering of the liquid into small droplets as depicted in FIG. 3. Because the bubble growth rate decreases with increasing process chamber pressure, the newly discovered mechanism appears to be of significant importance only in determining the characteristics of the cryogenic aerosol at low process chamber pressures.

These different mechanisms affect both the droplet size as well as the phase (liquid or solid) of the droplet. At higher (e.g. about $2.0 \times 10^4$ Pascal) process chamber pressures the standard break up mechanisms dominate leading to larger droplets. In contrast, at process chamber pressures lower than that taught by the prior art, i.e. about $1.6 \times 10^4$ Pascal or less, the effervescent flashing mechanism appears to be dominant. This leads to smaller droplets. A given mass flow through the nozzle will, therefore, produce more aerosol particles under the conditions where effervescent flashing is operative leading to a higher density aerosol. In addition, evaporation of material from the aerosol particles removes heat from the aerosol particles and may assist in solidification of some or all of the remaining particle mass. When the aerosol particles are small, less heat needs to be removed to cause solidification. Thus, small aerosol particles freeze rapidly leading to many small solid or partially solid aerosol particles.

The process implications are important. Control of the process chamber pressure dramatically affects the characteristics of the cryogenic aerosol. For contaminant particle and residue removal, in particular for the removal of small contaminant particles ($\leq$about 0.3 micron), as well as for elimination of stiction in MEMS devices, a cryogenic aerosol that is composed of mostly solid aerosol particles is considered desirable for improved performance. Operating at process chamber pressures below that of the prior art is thus highly and unexpectedly beneficial.

Additional benefits of operating at a low pressure are less dependence on aerosol impingement angle, nozzle to substrate distance and gas/liquid pressure upstream of the nozzle.

Other parameters that affect the fraction of solid aerosol particles in the aerosol include the gas:liquid ratio of the cryogen delivered to the nozzle, gas/liquid pressure, dewar back pressure, chemical composition of the cryogen, the total gas flow, and the distance between the substrate and the nozzle. The gas:liquid ratio influences the droplet size formed upon expulsion of the aerosol from the nozzle. A higher gas:liquid ratio generally leads to smaller droplets in the aerosol that are more likely to freeze prior to impacting the substrate. The gas/liquid pressure in the nozzle can impact the aerosol particle size distribution and velocity. In general, a higher gas/liquid pressure in the nozzle can produce smaller aerosol particles with higher velocity compared to a lower gas/liquid pressure in the nozzle. The dewar back pressure controls the amount of heat exchange between the process gas(es) and the heat exchanger. The amount of heat exchanged, in turn, impacts the gas:liquid ratio discussed above. The chemical composition of the cryogen will also affect the aerosol properties because the condensation temperature will change for different chemicals and chemical mixtures. The chemical composition also affects the gas:liquid ratio discussed above. The total gas flow will impact the gas/liquid pressure and the gas:liquid ratio. Another parameter that will affect the amount of solid aerosol particles impinging on the substrate surface is the distance between the substrate and the nozzle. A larger distance will allow more time for aerosol particles to freeze and lead to more solid aerosol particles striking the surface. Of course, increasing the distance to the substrate may result in reducing aerosol particle velocity due to turbulent mixing in the jet and may reduce the number of aerosol particles due to evaporation. The optimal balance of these parameters is well within the skill in the art.

Figure 4:
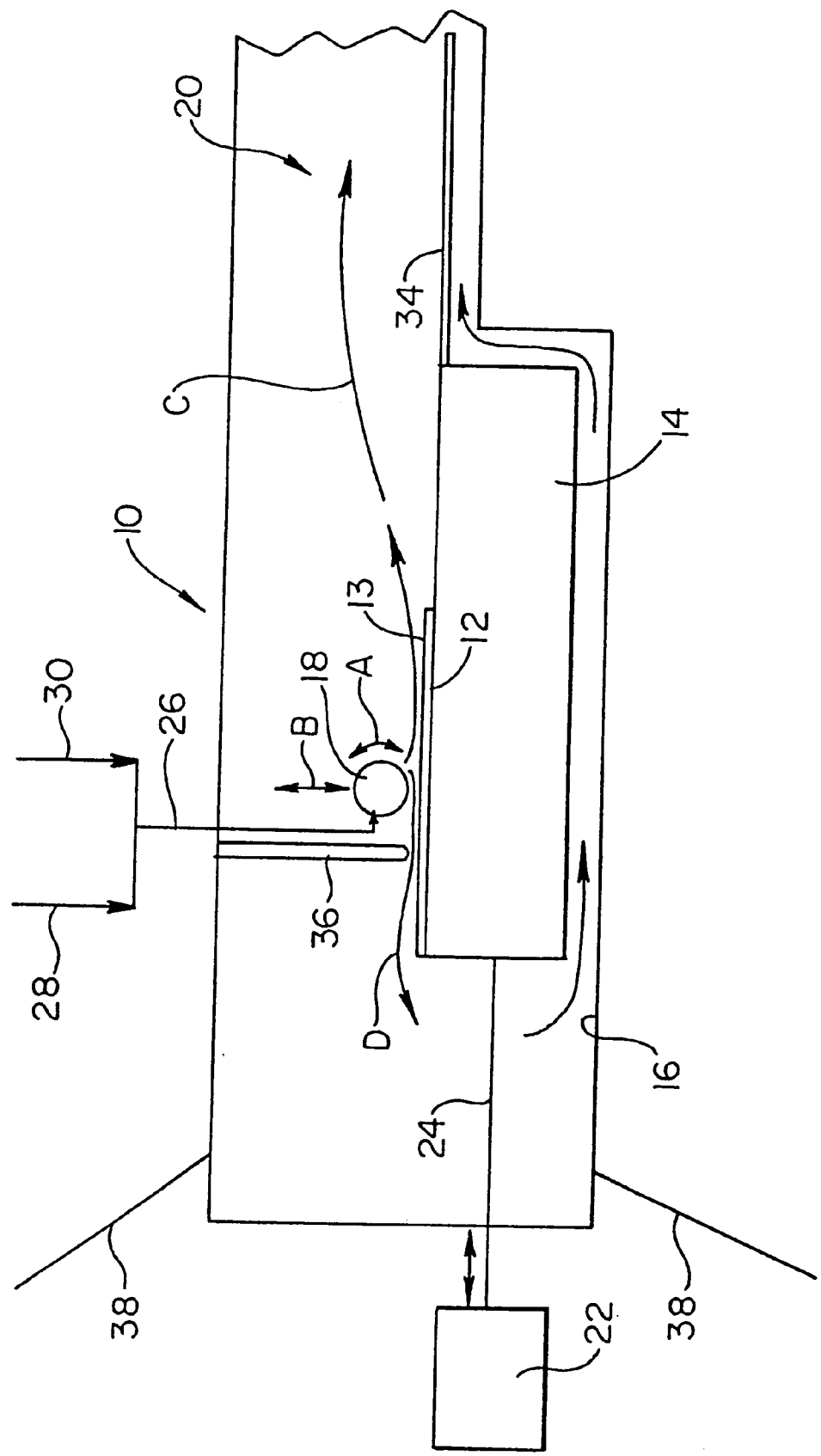
FIG. 4 is a schematic representation of the apparatus used in the present invention.

An apparatus as depicted in FIG. 4 may be used to treat the substrate. Referring to FIG. 4, the substrate 12 is mounted on a movable chuck 14, which is at ambient or heated temperature. The term chuck is used to mean a device which functionally supports the object to be treated. The chuck includes an appropriate slide or glide mechanism or a turntable. A rotatable nozzle 18, from which the cryogenic aerosol emanates, is supported within the process chamber 16. Nozzle 18 is connected with a supply line 26, which itself may be connected further with discreet supply lines 28 and 30 connected with the actual gas or liquid supplies of argon, nitrogen or the like, depending on the specific process. Further processing steps, such as gas cooling, may take place within the supply line 26, again, depending on the specific process, so that the nozzle 18 expels the desired cryogenic aerosol. The inside of the process chamber 16 may be connected further with either a vacuum device or a pressurizing device or both for selectively controlling the desired pressure within the process chamber 16 based on the specific process. A vacuum device (not shown) may be connected through the exhaust duct 20.

To control the fluid dynamics within the process chamber 16, a flow separator comprising a baffle plate 34 is connected to an end of the moveable chuck 14 and to extend into the exhaust duct 20. Additionally, a shroud 36 is provided within the process chamber 16 and comprises a plate connected to the process chamber 16, such as its upper wall, for controlling flow around the nozzle. The controlling of the fluid dynamics within the process chamber 16 by the baffle plate 34 and the shroud 36 are more fully described in copending U.S. application Ser. No. 08/712,342, filed Sep. 11, 1996 and incorporated herein by reference.

Also shown in FIG. 4, a curtain gas, preferably an inert gas such as nitrogen, can be introduced into the process chamber 16 via one or more supply conduits 38. Although not necessary, such curtain gas is preferably introduced at a location opposite the exhaust in the process chamber 16. The curtain gas may be used to compensate or make-up for slight pressure deviations within the process chamber caused by instabilities in the nozzle and pressure controls allowing for the overall positive flow across the process chamber. Conventional supply techniques may be used. The nozzle angle is optimized for particle removal and flow dynamics.

In one embodiment, an argon/nitrogen mixture is filtered free of any contaminating particles and cooled to a temperature at or near its liquification point in a heat exchanger. Following the cooling operation, the argon/nitrogen mixture is a combination of gas and liquid.

In another embodiment, an argon/nitrogen mixture is filtered free of any contaminant particles and pre-cooled to a temperature slightly above its liquification point. Following the pre-cooling operation, the argon/nitrogen mixture is gas. The pre-cooling operation permits additional purification by allowing for condensation and removal of any remaining trace impurities onto the heat exchanger walls. Pre-cooling may be combined with simultaneous removal of trace impurities using a molecular sieve or catalytic impurities removal device or any other suitable impurities filter upstream of the heat exchanger. The argon/nitrogen mixture may then be fed into a second heat exchanger for the purpose of further cooling the mixture near to the temperature of liquification. Such methods for removing trace molecular impurities from inert gases are well known in the field. The pressure of the argon/nitrogen mixture is typically held in the range of $2.4 \times 10^5$ Pascal to $4.8 \times 10^6$ Pascal, preferably $2.4 \times 10^5$ Pascal to $7.8 \times 10^5$ Pascal. The temperature of the mixture is typically in the range of from about $-200°$ C. to about $-120°$ C. and preferably from about $-200°$ C. to about $-150°$ C. The nitrogen flow rate is between 0 and 600 standard liters per minute (slpm), preferably 100–200 slpm, and the argon flow rate is between 0 and 600 slpm, preferably 300–600 slpm.

The cooled mixture, whether liquid or liquid/gaseous, is then expanded from a nozzle 18 or expansion valve from a pressure of approximately $2.4 \times 10^5$ Pascal to $4.8 \times 10^6$ Pascal, preferably $2.4 \times 10^5$ Pascal to $7.8 \times 10^5$ Pascal, to a lower pressure, and a temperature at or near the liquification temperature of the argon/nitrogen mixture to form at least substantially solid aerosol particles of the mixture in a mixture with gaseous argon and/or nitrogen, the aerosol particles being formed downstream of the nozzle as a result of the effervescent flashing that occurs on expansion of the liquid and gas. To accomplish this result, the process chamber is maintained at a pressure of about $1.6 \times 10^4$ Pascal or less where the aerosol breakup is dominated by the rapid nucleation and growth of bubbles within the liquid. More preferably, the process chamber is maintained at a pressure of about $1.2 \times 10^4$ Pascal or less and most preferably, at a pressure of about $8.0 \times 10^3$ Pascal or less. The nozzle preferably is rotatable and translatable toward or away from the substrate to be treated as described in copending application Ser. No. 08/773,489 filed Dec. 23, 1996. The nozzle may be a nozzle within nozzle design as disclosed in copending application Ser. No. 08/773,489. Single tube and other nozzles may also be used as well.

The nozzle and the cryogenic aerosol emanating from the nozzle, are directed at the substrate at an angle between substantially parallel and perpendicular, suitably at an inclined angle between 0° and 90°, more preferably at an angle between 30° and 60° toward the surface of the substrate 12 containing the contaminant. One skilled in the art will recognize that the cryogenic aerosol will likely diverge from the nozzle such that a steady single stream of particles will not necessarily be directed at a contaminant. Rather, the aerosol itself may diverge from the nozzle in a range from a 1° to 180° angle. The jet is typically at a vertical distance of approximately several millimeters to several centimeters above the contaminant. Depending on the choice of nozzle and/or chamber design, multiple substrates may be treated simultaneously.

One device capable of forming such a cryogenic aerosol and so treating substrates is an ARIES™ cryogenic aerosol tool, supplied by FSI International, Inc. Chaska, Minn., and configured with the above described process chamber and nozzle.

In the preferred embodiment, a nitrogen/argon mixture is used as the cryogen. Other chemicals, however, such as helium, nitrogen, neon, argon, krypton, xenon, carbon dioxide, inert hydrocarbons and mixtures thereof may be used as well. In another embodiment a nitrogen-only aerosol is used. Gas and/or liquid nitrogen are used as the cryogen. A Dewar filled with liquid nitrogen and pressurized with nitrogen gas supplies a stream of liquid and gaseous nitrogen directly to the nozzle. Nitrogen flow rates of up to 1000 slpm may be used. In yet another embodiment, an argon-only aerosol is used. Gas and/or liquid argon are used as the cryogen. A Dewar filled with liquid argon and pressurized with gas argon or nitrogen supplies a stream of liquid and gaseous argon directly to the nozzle. In yet other embodiments, the cryogenic aerosol comprises one or more chlorofluorohydrocarbons.

The invention is illustrated by the following non-limiting examples.

Example 1a, Comparative Example 1b

A cryogenic aerosol was formed by expanding a stream of nitrogen into a modified ARIES™ SYSTEM process chamber at 5 different process chamber pressures. The ARIES™ SYSTEM process chamber was modified to allow for optical access to areas in close proximity to the nozzle. The nitrogen was cooled in a heat exchanger to produce a liquid/gaseous stream. The heat exchanger was a Dewar containing liquid nitrogen. The Dewar back pressure was 0 psig. The nitrogen gas flow was 50 slpm and the nitrogen pressure was 36–40 psig.

An Aerometrics, Inc. Phased Doppler particle analyzer (PDPA) was used to perform the particle velocity analysis. The PDPA system splits the single light beam generated by an argon laser operating at a wavelength of 488 nm into two beams then sends both beams through collimating and transmitting lenses (100 mm). The light beams passed through a ⅜ inch thick optical grade Pyrex® window and entered the vacuum chamber. The light beams intersected the aerosol, and each other, at a distance 0.04 meters (1.75 inches) from the aerosol nozzle. The distance between the laser light transmitting lens and the beam crossing was 0.1 m. The measurement volume was approximately 1 mm long with a 100 $\mu m^2$ cross section. The laser light (scattered and not scattered) exited the vacuum chamber through a second ⅜ inch thick optical grade Pyrexe window. The detector was located approximately 0.5 m from where the laser beams intersected the aerosol at an angle of approximately 30° with respect to the initial light direction (but in the same horizontal plane as the laser). The raw data was deconvoluted and fit to a gaussian curve using proprietary software supplied with the PDPA.

Figure 5A:
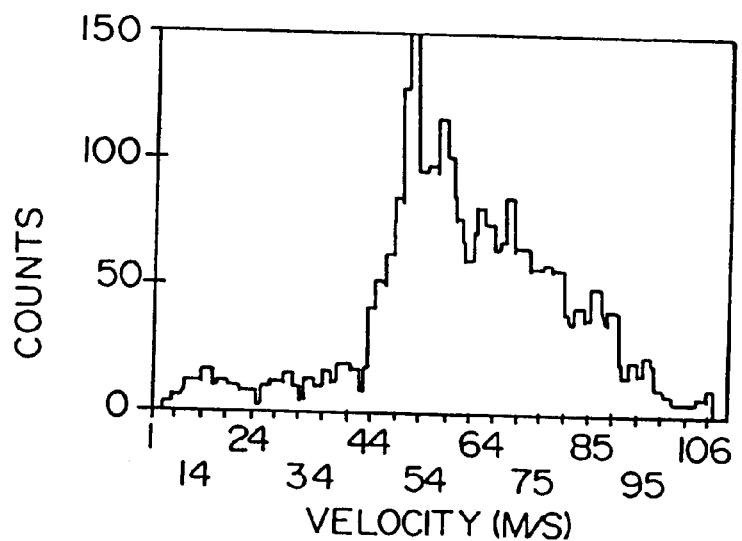
FIGS. 5a and 5b depict the velocity distribution for an inventive aerosol at a chamber pressure of $1.6 \times 10^3$ Pa and a prior art aerosol at a chamber pressure of $4.0 \times 10^4$ Pa respectively.
Figure 5B:
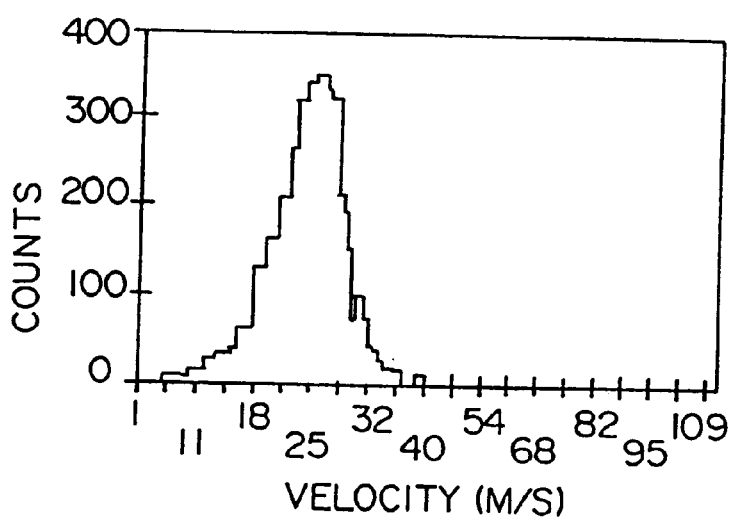

FIGS. 5a and 5b depict the distribution of aerosol particle velocities for an aerosol spray of the present invention at chamber pressures of $1.6\times10^3$ Pa and for a prior art aerosol spray at $4.0\times10^4$ Pa. The figures demonstrate that at the reduced chamber pressure of the present invention, the mean velocity of the aerosol particles increases significantly from 24 m/s at $4.0\times10^4$ Pa to 61 m/s at $1.6\times10^3$ Pa.

Example 2

A cryogenic aerosol was formed as in Example 1 except that the nitrogen gas flow was 95 slpm. A Malvern Instruments Fraunhofer diffraction apparatus (model #2600) was used to perform the aerosol size measurements. This instrument has two main parts; a transmitter box and a receiver box. The front of the transmitter box was located approximately 0.3 m from the front of the receiver box. The transmitter box contains a He-Ne laser with a wavelength of 633 nm. The laser beam was collimated by a lens on the Malvern Instrument and the resulting beam diameter was between 7 and 10 mm. The laser light was then passed into a vacuum chamber through a ⅜ inch thick optical grade Pyrex® window. The laser light then intersected the aerosol normal to the aerosol flow direction at a distance of 0.1 m (4.5 inches) from the aerosol nozzle. The measurement area was between 7 and 10 mm. The laser light (scattered and not scattered) exited the vacuum chamber through a second ⅜ inch thick optical grade Pyrex® window. The receiving lens of the Malvern Instrument receiver box focused the scattered light as well as the transmitted light onto a detector. The transmitted light is focused to a point on the optical axis while the scattered light forms a series of concentric rings (Fraunhofer diffraction pattern). Because the receiving lens performs a Fourier transform on the scattered light, light scattered at a given angle by a particle located anywhere in the illuminated sample volume will be focused at the same radial position in the transform plane. Thus, the resulting pattern is unaffected by particle location or motion. The raw data was deconvoluted and then fit to a log normal distribution using proprietary software supplied with the Fraunhofer diffraction apparatus.

Table 1 demonstrates that at the decreased chamber pressure of the present invention, the Sauter mean diameter of aerosol particles is decreased from the Sauter mean diameter of aerosol particles of the prior art at higher chamber pressure.

TABLE I

Particle size for various chamber pressures

| Pressure (Pa) | Sauter mean diameter (microns) |
|---|---|
| $5.3\times10^3$ | 8 |
| $4.0\times10^4$ | 48 |

Example 3

Silicon substrates contaminated with particulate matter ($Si_3N_4$) were subjected to cryogenic aerosol treatment in an ARIES™ cryogenic aerosol tool at two different process chamber pressures. The cryogenic aerosol was formed by expanding a 3:1 mixture of argon and nitrogen into a process chamber. Argon gas flow was 360 slpm, nitrogen gas flow was 120 slpm. Argon and nitrogen were combined in a process gas line prior to cooling in a heat exchanger. The heat exchanger was a Dewar containing liquid nitrogen. The Dewar back pressure was 36 psia. The cooled liquid/gaseous mixture was then expanded through a nozzle into the process chamber. Removal efficiency was calculated based on the number of contaminant particles prior to treatment and the number of contaminant particles post treatment. Table II demonstrates that contaminant removal efficiency increases with a decreased process chamber pressure. In particular, for small contaminant particle sizes of 0.15–0.3 microns, a dramatic improvement in contaminant removal efficiency results from operating at lower process chamber pressures.

TABLE II

| | Removal efficiency for various particle sizes (percent) | | | | |
|---|---|---|---|---|---|
| Pressure (Pa) | 0.15–0.2 μm | 0.2–0.3 μm | 0.3–1.0 μm | 1.0–5.0 μm | >5.0 μm |
| $8 \times 10^3$ | 93.7% | 98.6% | 99.2% | 98.9% | 98.4% |
| $4 \times 10^4$ | 60.9% | 86.0% | 96.2% | 95.8% | 96.8% |

The inventive process can also be usefully employed to eliminating stiction as disclosed in the application of David S. Becker, Ronald J. Hanestad, Gregory P. Thomes, James F. Weygand, Larry D. Zimmerman entitled, "Eliminating Stiction With The Use Of Cryogenic Aerosol" filed concurrently herewith and incorporated herein by reference.

Those skilled in the art will recognize that the process of the invention will also be useful in applications other than those specifically identified herein and such other applications should be considered to be within the scope of the patent granted hereon.

What is claimed is as follows:

1. A method for treating a substrate by impinging the substrate with a cryogenic aerosel spray wherein said cryogenic aerosol spray is formed by forming a first aerosol spray comprising liquid particles and gas bubbles by expanding a pressurize liquid stream or liquid/gasous stream of one or more cryogens at a first pressure through a nozzle into a process chamber having a pressure of about $1.6 \times 10^4$ Pascal or less; and effervescent flashing said first aerosol spray so as to form a cryogenic aerosol spray of at least substantially solid aerosol particle downstream from the nozzle, wherein said effervescent flashing promotes growth of said gas bubbles in said first aerosol spray and said gas bubbles break up said liquid particles to said substantially solid aerosol particles having a decreased particle size.

2. The method of claim 1 wherein the at least one cryogen is selected from the group consisting of argon, nitrogen and mixtures thereof.

3. The method of claim 2 wherein the cryogenic aerosol spray comprises at least one gas and said substantially solid aerosol particles, both the gas and the particles comprising at least one chemical selected from the group consisting of helium, nitrogen, neon, argon, krypton, xenon, carbon dioxide, chlorofluorohydrocarbons, inert hydrocarbons and mixtures thereof.

4. The method of claim 1 wherein the substrate is contaminated with particles smaller than about 0.3 micron.

5. The method of claim 2 wherein the pressure of the liquid stream or liquid/gaseous stream in the nozzle is approximately $4.8 \times 10^6$ Pascal or less.

6. The method of claim 1 wherein the at least one cryogen comprises carbon dioxide.

7. The method of claim 3 wherein the cryogenic aerosol spray is formed from liquid and gaseous nitrogen.

8. The method of claim 3 wherein the cryogenic aerosol spray is formed from liquid and gaseous argon.

9. The method of claim 3 wherein the pressure of the process chamber is about $1.2 \times 10^4$ Pascal or less.

10. The method of claim 3 wherein the pressure of the process chamber is about $8.0 \times 10^3$ Pascal or less.

11. The method of claim 5 wherein the pressure of the liquid stream or liquid/gaseous stream in the nozzle is from approximately $2.4 \times 10^5$ Pascal to $4.8 \times 10^6$ Pascal.

* * * * *